(12) United States Patent
Matsui et al.

(10) Patent No.: US 12,369,247 B2
(45) Date of Patent: Jul. 22, 2025

(54) WIRING CIRCUIT BOARD

(71) Applicant: NITTO DENKO CORPORATION, Osaka (JP)

(72) Inventors: Hideki Matsui, Osaka (JP); Naoki Shibata, Osaka (JP); Ryosuke Sasaoka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 272 days.

(21) Appl. No.: 18/315,878

(22) Filed: May 11, 2023

(65) Prior Publication Data

US 2023/0380058 A1    Nov. 23, 2023

(30) Foreign Application Priority Data

May 19, 2022  (JP) .................................. 2022-082270
Nov. 15, 2022 (JP) .................................. 2022-182687

(51) Int. Cl.
*H05K 1/02*       (2006.01)
*H05K 1/11*       (2006.01)

(52) U.S. Cl.
CPC ........... *H05K 1/0296* (2013.01); *H05K 1/117* (2013.01)

(58) Field of Classification Search
CPC .......... H05K 1/02; H05K 1/11; H05K 1/0296; H05K 1/117

USPC ....................................................... 174/261
See application file for complete search history.

(56) References Cited

U.S. PATENT DOCUMENTS

2020/0402901 A1    12/2020  Yasutake

FOREIGN PATENT DOCUMENTS

| JP | 2006-229155 A | 8/2006 |
|---|---|---|
| JP | 2019-212679 A | 12/2019 |
| JP | 2019-220563 A | 12/2019 |
| JP | 2021-002587 A | 1/2021 |
| JP | 2021-178479 A | 11/2021 |

*Primary Examiner* — Tremesha W Burns
(74) *Attorney, Agent, or Firm* — Edwards Neils LLC; Jean C. Edwards, Esq.

(57) ABSTRACT

Provided is a wiring circuit board capable of suppressing peeling of a terminal from an insulating layer. The wiring circuit board includes a base insulating layer, and a conductive pattern disposed on one surface of the base insulating layer in a thickness direction. The conductive pattern includes a wiring and a terminal. The terminal protrudes from one end edge of the wiring. The terminal includes a first terminal layer and a second terminal layer. A ratio (Y/X) of the volume Y of the wiring in a folded region with respect to the volume X of the terminal is 0.1 or more. The folded region is a region when a region of the terminal when viewed in the thickness direction is folded back toward the opposite side in a protruding direction of the terminal with the one end edge of the wiring as a starting point.

8 Claims, 10 Drawing Sheets

WIRING CIRCUIT BOARD

TECHNICAL FIELD

Cross-Reference to Related Application

The present application claims priority from Japanese Patent Applications No. 2022-82270 filed on May 19, 2022 and No. 2022-182687 filed on Nov. 15, 2022, the contents of which are hereby incorporated by reference into this application.

The present invention relates to a wiring circuit board.

Background Art

A wiring circuit board including an insulating layer and a conductive pattern disposed on the upper surface of the insulating layer is known (ref: for example, Patent Document 1 below). In the wiring circuit board described in Patent Document 1, the conductive pattern includes a wiring and a terminal continuous with the wiring. The terminal is electrically connected to an external device through a solder.

CITATION LIST

Patent Document

Patent Document 1: Japanese Unexamined Patent Publication No. 2019-212679

SUMMARY OF THE INVENTION

Problem to be Solved by the Invention

The terminal may have multiple layers in accordance with its application and purpose. In this case, the heat dissipation of the terminal is increased. Therefore, when the terminal is connected to the external device using the solder, it is necessary to heat the solder at a high temperature.

However, in this case, there is a problem that the terminal is easily peeled from the insulating layer.

The present invention provides a wiring circuit board capable of suppressing peeling of a terminal from an insulating layer.

Means for Solving the Problem

The present invention (1) includes a wiring circuit board including an insulating layer, and a conductive pattern disposed on one surface of the insulating layer in a thickness direction, wherein the conductive pattern includes a wiring, and a terminal protruding from one end edge of the wiring; the terminal includes a first terminal layer disposed on one surface of the insulating layer in the thickness direction, and a second terminal layer disposed on one surface of the first terminal layer in the thickness direction; and a ratio (Y/X) of the volume Y of the wiring in a folded region of the terminal when viewed in the thickness direction with respect to the volume X of the terminal is 0.1 or more, the folded region being folded back toward the opposite side in a protruding direction of the terminal with the one end edge of the wiring as a starting point.

In the wiring circuit board, the ratio (Y/X) of the volume Y of the wiring in the folded region with respect to the volume X of the terminal is as high as 0.1 or more. Therefore, even when a solder is disposed on one surface of the terminal, and heated at a high temperature, it is possible to sufficiently escape the heat transferred to the terminal to the wiring. Therefore, it is possible to suppress a decrease in adhesive force at the boundary between the terminal and the insulating layer. As a result, it is possible to suppress peeling of the terminal from the insulating layer.

The present invention (2) includes the wiring circuit board described in (1), wherein the wiring consists of a first wiring layer continuous with the first terminal layer or a second wiring layer continuous with the second terminal layer.

The present invention (3) includes the wiring circuit board described in (1) or (2) further including a metal supporting layer disposed on the other surface of the insulating layer in the thickness direction.

Since the wiring circuit board further includes the metal supporting layer disposed on the other surface of the insulating layer in the thickness direction, it is possible to escape the heat transferred to the terminal through the solder not only to the wiring but also to the metal supporting layer.

The present invention (4) includes the wiring circuit board described in any one of (1) to (3), wherein the conductive pattern includes a plurality of wirings spaced apart from each other, and a plurality of terminals corresponding to the plurality of wirings, each of the terminals protruding from one end edge of each of the plurality of wirings; each of the plurality of terminals includes the first terminal layer and the second terminal layer; and a ratio (Y/X) of the volume Y of the wiring in each of a plurality of folded regions when each region of the plurality of terminals when viewed in the thickness direction is folded back toward the opposite side in the protruding direction of each terminal with the one end edge of each of the plurality of wirings as the starting point with respect to the volume X of each of the plurality of terminals is 0.1 or more.

In the wiring circuit board, since the ratio of the volume Y of the wiring in each of the plurality of folded regions with respect to the volume X of each of the plurality of terminals is 0.1 or more, even when the heat is applied simultaneously to the plurality of terminals, it is possible to suppress the peeling of each of the plurality of terminals from the insulating layer.

The present invention (5) includes the wiring circuit board described in any one of (1) to (4), wherein the ratio (Y/X) is below 1.

Effect of the Invention

The present invention provides a wiring circuit board capable of suppressing peeling of a terminal from an insulating layer.

BRIEF DESCRIPTION OF THE DRAWINGS

FIG. 12A illustrating a plan view and

FIG. 12B illustrating a cross-sectional view.

FIG. 13A illustrating a plan view,

FIG. 13B illustrating a cross-sectional view along an X-X line in FIG. 13A, and FIG. 13C illustrating a cross-sectional view along a Y-Y line in FIG. 13A.

DESCRIPTION OF EMBODIMENTS

Figure 1:
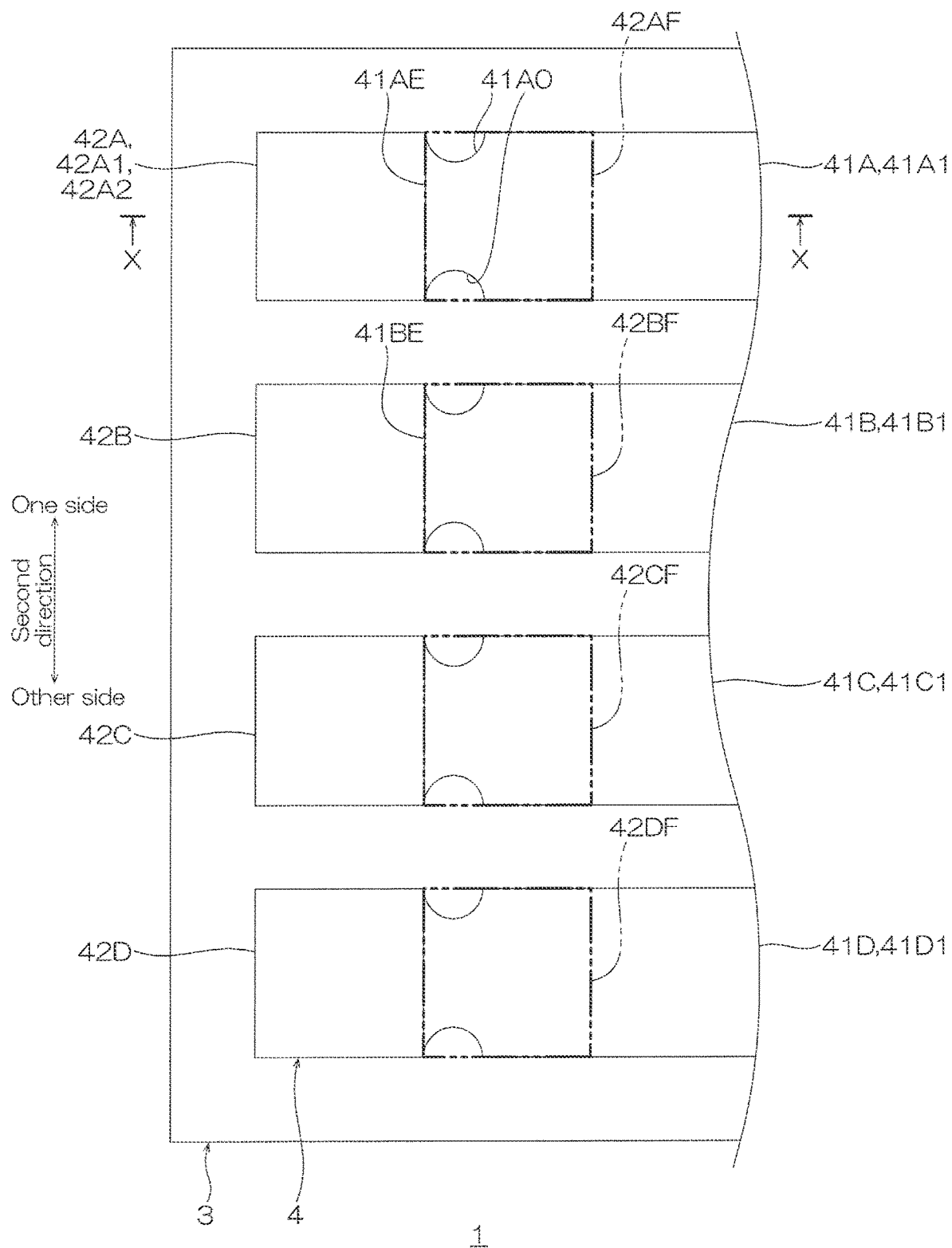
FIG. 1 shows an enlarged plan view of one embodiment of a wiring circuit board of the present invention.

1. One Embodiment of Wiring Circuit Board

One embodiment of a wiring circuit board of the present invention is described with reference to FIGS. 1 and 2.

1.1 Wiring Circuit Board 1

A wiring circuit board 1 has a thickness. The wiring circuit board 1 has a sheet shape. The wiring circuit board 1 extends in a first direction. The first direction is perpendicular to a thickness direction. The wiring circuit board 1 also extends in a second direction. The second direction is perpendicular to the thickness direction and the first direction. In the present embodiment, a length of the wiring circuit board 1 in the second direction is shorter than the length of the wiring circuit board 1 in the first direction.

The wiring circuit board 1 includes a metal supporting layer 2, a base insulating layer 3 as one example of an insulating layer, a conductive pattern 4, and a cover insulating layer 5.

1.2 Metal Supporting Layer 2

The metal supporting layer 2 is disposed in the other end portion of the wiring circuit board 1 in the thickness direction. The metal supporting layer 2 has a thickness. The metal supporting layer 2 has a sheet shape. The metal supporting layer 2 extends in the first direction and the second direction. Examples of a material for the metal supporting layer 2 include iron, stainless steel, copper, and copper alloys. A thickness of the metal supporting layer 2 is, for example, 10 µm or more, preferably 25 µm or more, and for example, 500 µm or less, preferably 250 µm or less.

1.3 Base Insulating Layer 3

The base insulating layer 3 is disposed on one surface of the metal supporting layer 2 in the thickness direction. In other words, the metal supporting layer 2 is disposed on the other surface of the base insulating layer 3 in the thickness direction. The base insulating layer 3 is in contact with one surface of the metal supporting layer 2. The base insulating layer 3 has a thickness. The base insulating layer 3 has a sheet shape. The base insulating layer 3 extends in the first direction and the second direction. In the present embodiment, one end surface of the base insulating layer 3 in the first direction is flush with one end surface of the metal supporting layer 2 in the first direction. In one end portion in the first direction of the wiring circuit board 1, each of both end surfaces of the base insulating layer 3 in the second direction is flush with each of both end surfaces of the metal supporting layer 2 in the second direction.

Examples of the material for the base insulating layer 3 include insulating resins. Examples of the insulating resin include polyimide resins and epoxy resins. As the insulating resin, preferably, a polyimide resin is used.

The thickness of the base insulating layer 3 is, for example, 1 µm or more, preferably 5 µm or more, and for example, 100 µm or less, preferably 50 µm or less.

1.4 Conductive Pattern 4

The conductive pattern 4 is disposed on one surface of the base insulating layer 3 in the thickness direction. Examples of the material for the conductive pattern 4 include copper, silver, gold, iron, aluminum, chromium, and alloys of these. As the material for the conductive pattern 4, preferably, from the viewpoint of ensuring excellent heat dissipation and adhesion, copper, and copper alloys are used. The conductive pattern 4 includes a plurality of wirings 41A, 41B, 41C, and 41D, and a plurality of terminals 42A, 42B, 42C, and 42D.

1.4.1 Wirings 41A, 41B, 41C, and 41D

The plurality of wirings 41A, 41B, 41C, and 41D are spaced apart from each other in the second direction. Each of the plurality of wirings 41A, 41B, 41C, and 41D extends in the first direction. The plurality of wirings 41A, 41B, 41C, and 41D are disposed on one surface of the base insulating layer 3 in the thickness direction from the other end portion in the first direction over one end portion. The wirings 41A, 41B, 41C, and 41D are disposed in order from one side in the second direction toward the other side.

The wiring 41A has two recessed portions 41A0. Each of the two recessed portions 41A0 is disposed in one end portion of the wiring 41A in the first direction. The two recessed portions 41A0 face each other in the second direction. The two recessed portions 41A0 are spaced apart from each other in the second direction. The recessed portion 41A0 is recessed inwardly in the second direction with respect to an intermediate portion of the wiring 41A in the first direction. In the present embodiment, each of the two recessed portions 41A0 has a generally semicircular shape. Each of the two recessed portions 41A0 may be a generally rectangular shape. In the present embodiment, the intermediate portion of the wiring 41A in the first direction has a straight shape extending in the first direction. In the present embodiment, the intermediate portion is a portion excluding the recessed portion 41A0.

A width of the intermediate portion of the wiring 41A is, for example, 5 µm or more, preferably 10 µm or more, and for example, 2000 µm or less, preferably 1500 µm or less. The above-described width is the length of the wiring 41A in the second direction.

The length in the second direction of each of the two recessed portions 41A0 is, for example, 1 µm or more, preferably 5 µm or more, and for example, 750 µm or less, preferably 500 µm or less. The length in the first direction of each of the two recessed portions 41A0 is, for example, 5 µm or more, preferably 10 µm or more, and for example, 2000 µm or less, preferably 1500 µm or less. A ratio of the length in the first direction of the recessed portion 41A0 to the width of the intermediate portion of the wiring 41A is, for example, 0.0025 or more, preferably 0.01 or more, and for example, 20 or less, preferably 10 or less.

In the present embodiment, the wiring 41A includes a first wiring layer 41A1. In the present embodiment, the wiring 41A preferably consists of the first wiring layer 41A1. The first wiring layer 41A1 has the same shape as the wiring 41A when viewed in the thickness direction.

The thickness of the first wiring layer 41A1 is, for example, 1 μm or more, preferably 3 μm or more, and for example, 50 μm or less, preferably 30 μm or less.

An arrangement, a shape, a layer structure, and a dimension of the wirings 41B, 41C, and 41D are the same as those of the wiring 41A. In the present embodiment, the thickness of the plurality of first wiring layers 41A1, 41B1, 41C1, and 41D1 is the same.

1.4.2 Terminals 42A, 42B, 42C, and 42D

The plurality of terminals 42A, 42B, 42C, and 42D correspond to the plurality of wirings 41A, 41B, 41C, and 41D. The plurality of wirings 41A, 41B, 41C, and 41D correspond to the plurality of terminals 42A, 42B, 42C, and 42D. The plurality of terminals 42A, 42B, 42C, and 42D are disposed in one end portion of the wiring circuit board 1 in the first direction. In the present embodiment, the plurality of terminals 42A, 42B, 42C, and 42D are spaced apart from each other in the second direction. The terminals 42A, 42B, 42C, and 42D are disposed in order from one side in the second direction toward the other side.

1.4.2.1 Terminal 42A

The terminal 42A is disposed in one end portion in the first direction in one surface of the base insulating layer 3. The terminal 42A protrudes from one end edge 41AE of the wiring 41A in the first direction. Specifically, the terminal 42A protrudes from the one end edge 41AE of the wiring 41A toward one side in the first direction. In the present embodiment, a protruding direction of the terminal 42A corresponds to one side in the first direction. In the present embodiment, the one end edge 41AE of the wiring 41A is located on a line connecting one end edges in the first direction of the two recessed portions 41A0. In the present embodiment, the terminal 42A has a generally rectangular shape when viewed in the thickness direction.

The terminal 42A includes the first terminal layer 42A1 and a second terminal layer 42A2. In the present embodiment, the terminal 42A preferably consists of the first terminal layer 42A1 and the second terminal layer 42A2. In the terminal 42A, the first terminal layer 42A1 and the second terminal layer 42A2 are disposed in order toward one side in the thickness direction. Each of the first terminal layer 42A1 and the second terminal layer 42A2 has generally the same shape as the terminal 42A when viewed in the thickness direction.

1.4.2.2 First Terminal Layer 42A1

The first terminal layer 42A1 is disposed in the other end portion of the terminal 42A in the thickness direction. The first terminal layer 42A1 is disposed on one surface of the base insulating layer 3 in the thickness direction. The first terminal layer 42A1 is in contact with one surface of the base insulating layer 3.

The first terminal layer 42A1 is continuous with the first wiring layer 41A1. The first terminal layer 42A1 is located on the same plane as the first wiring layer 41A1.

The first terminal layer 42A1 has the same thickness as the first wiring layer 41A1. Specifically, the thickness of the first terminal layer 42A1 is, for example, 1 μm or more, preferably 3 μm or more, and for example, 50 μm or less, preferably 30 μm or less.

1.4.2.3 Second Terminal Layer 42A2

The second terminal layer 42A2 is disposed in one end portion of the terminal 42A in the thickness direction. The second terminal layer 42A2 is disposed on one surface of the first terminal layer 42A1 in the thickness direction. The second terminal layer 42A2 is in contact with one surface of the first terminal layer 42A1. The second terminal layer 42A2 is disposed on the opposite side to the base insulating layer 3 with respect to the first terminal layer 42A1. In the present embodiment, the second terminal layer 42A2 has the same shape as the first terminal layer 42A1 when viewed in the thickness direction.

In the present embodiment, when viewed in the thickness direction, an outer shape of the second terminal layer 42A2 matches the outer shape of the first terminal layer 42A1. When viewed in the thickness direction, the outer shape of the second terminal layer 42A2 is allowed to deviate from the outer shape of the first terminal layer 42A1.

In the present embodiment, the second terminal layer 42A2 is thicker than the first terminal layer 42A1 from the viewpoint of production process. Specifically, the thickness of the second terminal layer 42A2 is, for example, 2 μm or more, preferably 4 μm or more, and for example, 100 μm or less, preferably 60 μm or less. The ratio of the thickness of the second terminal layer 42A2 to the thickness of the first terminal layer 42A1 is, for example, 1.1 or more, preferably 1.5 or more, more preferably 2 or more, and for example, 10 or less, preferably 7 or less.

Although not shown, the second terminal layer 42A2 may have the same thickness as the first terminal layer 42A1.

1.4.2.4 Dimension of Terminal 42A

The length of the terminal 42A in the first direction is, for example, 50 μm or more, preferably 100 μm or more, and for example, 2000 μm or less, preferably 1500 μm or less. The length of the terminal 42A in the second direction is, for example, 50 μm or more, preferably 100 μm or more, and for example, 2000 μm or less, preferably 1500 μm or less. In the present embodiment, the length of the terminal 42A in the second direction has the same dimension as the width of the wiring 41A.

The volume X of the terminal 42A is not limited as long as it satisfies the ratio (Y/X) to be described next. The volume X of the terminal 42A is, for example, $2.5 \times 10^3$ μm$^3$ or more, preferably $5.0 \times 10^3$ μm$^3$ or more, and for example, $4.0 \times 10^8$ μm$^3$ or less, preferably $1.0 \times 10^8$ μm$^3$ or less. The volume X of the terminal 42A is the total sum of the volume of the first terminal layer 42A1 and the volume of the second terminal layer 42A2.

The volume of the first terminal layer 42A1 is obtained by multiplying the thickness of the first terminal layer 42A1 by the area of the first terminal layer 42A1 when viewed in the thickness direction. In the present embodiment, the area of the first terminal layer 42A1 is obtained by multiplying the length of the first terminal layer 42A1 in the second direction by the length of the first terminal layer 42A1 in the first direction.

The volume of the second terminal layer 42A2 is obtained by multiplying the thickness of the second terminal layer 42A2 by the area of the second terminal layer 42A2 when viewed in the thickness direction. In the present embodiment, the area of the second terminal layer 42A2 is obtained by multiplying the length of the second terminal layer 42A2 in the second direction by the length of the second terminal layer 42A2 in the first direction.

1.4.2.5 Volume Ratio

Then, the ratio (Y/X) of the volume Y of the wiring 41A in a folded region 42AF with respect to the volume X of the terminal 42A described above is 0.1 or more.

In a case where the ratio (Y/X) is below 0.1, when a solder (described later) 7 is disposed on one surface of the terminal 42A, and the solder 7 is heated, it is impossible to sufficiently escape the heat transferred to the terminal 42A to the wiring 41A. Therefore, adhesive force at the boundary between the terminal 42A and the base insulating layer 3 decreases. As a result, the terminal 42A is peeled from the base insulating layer 3.

The above-described ratio (Y/X) is preferably 0.15 or more, more preferably 0.2 or more, further more preferably 0.5 or more, and for example, 1 or less, preferably below 1, more preferably 0.9 or less, further more preferably 0.8 or less.

When the ratio is below the above-described upper limit, it is possible to dispose the wiring 41A for space saving, and to achieve high density of the wiring 41A. In particular, in the present embodiment, since the terminal 42A is multi-layered (two-layered), it is possible to increase the volume X of the terminal 42A, and even when the above-described ratio (Y/X) is decreased, it is possible to achieve the above-described effect.

The folded region 42AF is a region when a region of the terminal 42A when viewed in the thickness direction is folded back toward the opposite side in the protruding direction of the terminal 42A with the one end edge 41AE of the wiring 41A as a starting point. In the present embodiment, the opposite side in the protruding direction of the terminal 42A corresponds to the other side in the first direction.

In the present embodiment, since the terminal 42A has a generally rectangular shape when viewed in the thickness direction, the folded region 42AF has a generally rectangular shape. In the present embodiment, the folded region 42AF includes the two recessed portions 41A0 when viewed in the thickness direction.

In the present embodiment, the volume Y of the wiring 41A in the folded region 42AF is obtained by multiplying the thickness of the first wiring layer 41A1 by the area of the first wiring layer 41A1 included in the folded region 42AF. In the present embodiment, the area of the first wiring layer 41A1 does not include the area of the two recessed portions 41A0.

The arrangement, the shape, the layer structure, the dimension, and the ratio of the terminals 42B, 42C, and 42D are the same as those of the terminal 42A. In the present embodiment, the ratio of the volume Y of each of the wirings 41A, 41B, 41C, and 41D in each of the folded regions 42AF, 42BF, 42CF, and 42DF when each region of the plurality of terminals 42A, 42B, 42C, and 42D when viewed in the thickness direction is folded back toward the opposite side in the protruding direction of each of the plurality of terminals 42A, 42B, 42C, and 42D with each of the one end edges 41AE, 41BE, 41OE, and 41DE of each of the plurality of wirings 41A, 41B, 41C, and 41D as the starting point with respect to the volume X of each of the plurality of terminals 42A, 42B, 42C, and 42D is 0.1 or more.

Further, the ratio of the volume Y of each of the wirings 41A, 41B, 41C, and 41D in each of the folded regions 42AF, 42BF, 42CF, and 42DF with respect to the volume X of each of the plurality of terminals 42A, 42B, 42C, and 42D may be the same, or may be different from each other.

In the folded region 42AE, when viewed in the thickness direction, the ratio ($\beta/\alpha$) of the area $\beta$ of the wiring 41A to the area $\alpha$ of the terminal 42A when viewed in the thickness direction may be also below 0.1. Even when the ratio ($\beta/\alpha$) of the area is below 0.1, since the ratio (Y/X) of the volume described above is 0.1 or more, it is possible to improve the heat dissipation in the terminal 42A.

1.5 Cover Insulating Layer 5

The cover insulating layer 5 is disposed on one surface of the base insulating layer 3 in the thickness direction. As shown in FIG. 2, the cover insulating layer 5 covers the plurality of wirings 41A, 41B, 41C, and 41D. Specifically, the cover insulating layer 5 is in contact with at least the intermediate portions of the wirings 41A, 41B, 41C, and 41D in the first direction. Examples of the material for the cover insulating layer 5 include insulating resins. Examples of the insulating resin include polyimide resins and epoxy resins. As the insulating resin, preferably, a polyimide resin is used. The thickness of the cover insulating layer 5 is, for example, 1 µm or more, preferably 5 µm or more, and for example, 100 µm or less, preferably 50 µm or less.

1.6 Method for Producing Wiring Circuit Board 1

To produce the wiring circuit board 1, first, the base insulating layer 3 is formed on one surface of the metal supporting layer 2.

Next, the conductive pattern 4 is formed on one surface of the base insulating layer 3. Examples of a method for forming the conductive pattern 4 include additive methods and subtractive methods. Preferably, an additive method is used. In the present embodiment, the first wiring layer 41A1 and the first terminal layer 42A1 are simultaneously formed on one surface of the base insulating layer 3 using the additive method, and subsequently, the second terminal layer 42A2 is formed on one surface of the first terminal layer 42A1 using the additive method.

Subsequently, the cover insulating layer 5 is formed on one surface of the base insulating layer 3.

Thus, the wiring circuit board 1 is produced.

1.7 Connection of Wiring Circuit Board 1 to External Device

To electrically connect an external device to the wiring circuit board 1, first, the solder 7 is disposed on one surface of each of the terminals 42A, 42B, 42C, and 42D in the thickness direction.

Thereafter, an electrode (not shown) of the external device is disposed in the vicinity of the solder 7, and subsequently, the solder 7 is melted by heating. In the heating of the solder 7, for example, a laser is used. The output of the laser at the time of heating is, for example, 0.1 J or more, and for example, 0.3 J or less. When the output is the above-described lower limit or more, it is possible to reliably dispose the solder 7 in the terminal 42A by sufficiently heating the solder 7 in contact with the terminal 42A having a two-layer structure and having excellent heat dissipation.

Thus, the melted solder 7 is in contact with a plurality of electrodes. Thus, the terminals 42A, 42B, 42C, and 42D are electrically connected to the external device.

2. Function and Effect of One Embodiment

In the wiring circuit board 1, the ratio (Y/X) of the volume Y of the wiring 41A in the folded region 42AF with respect to the volume X of the terminal 42A is as high as 0.1 or more. Therefore, when the solder 7 is disposed on one surface of the terminal 42A, and/or when an electrode of the external device is brought closer to the solder 7, even when the solder 7 is heated at a high temperature, it is possible to sufficiently escape the heat transferred to the terminal 42A to the wiring 41A. Therefore, it is possible to suppress a decrease in the adhesive force at the boundary between the terminal 42A and the base insulating layer 3. As a result, it is possible to suppress peeling of the terminal 42A from the base insulating layer 3.

Since the wiring circuit board 1 further includes the metal supporting layer 2 disposed on the other surface of the base insulating layer 3 in the thickness direction, it is possible to escape the heat transferred to the terminal 42A through the solder 7 not only to the wiring 41A but also to the metal supporting layer 2.

Further, in the wiring circuit board 1, the ratio of the volume Y of each of the wirings 41A, 41B, 41C, and 41D in each of the plurality of folded regions 42AF, 42BF, 42CF, and 42DF with respect to the volume X of each of the plurality of terminals 42A, 42B, 42C, and 42D is 0.1 or more. Therefore, even when the heat is applied simultaneously to the plurality of terminals 42A, 42B, 42C, and 42D, it is possible to suppress the peeling of each of the plurality of terminals 42A, 42B, 42C, and 42D from the base insulating layer 3.

3. Modified Examples

In each modified example below, the same reference numerals are provided for members and steps corresponding to each of those in the above-described one embodiment, and their detailed description is omitted. Further, each modified example can achieve the same function and effect as that of one embodiment unless otherwise specified. Furthermore, one embodiment and each modified example can be appropriately used in combination.

In the cross-sectional views of FIGS. 3 to 7 and 12B, in order to clearly understand the shape of the conductive pattern 4, the cover insulating layer 5 is omitted.

In the plan views of FIGS. 8 to 12A, in order to clearly understand the shape of the conductive pattern 4, the base insulating layer 3 is omitted.

3.1 First Modified Example

Figure 3:
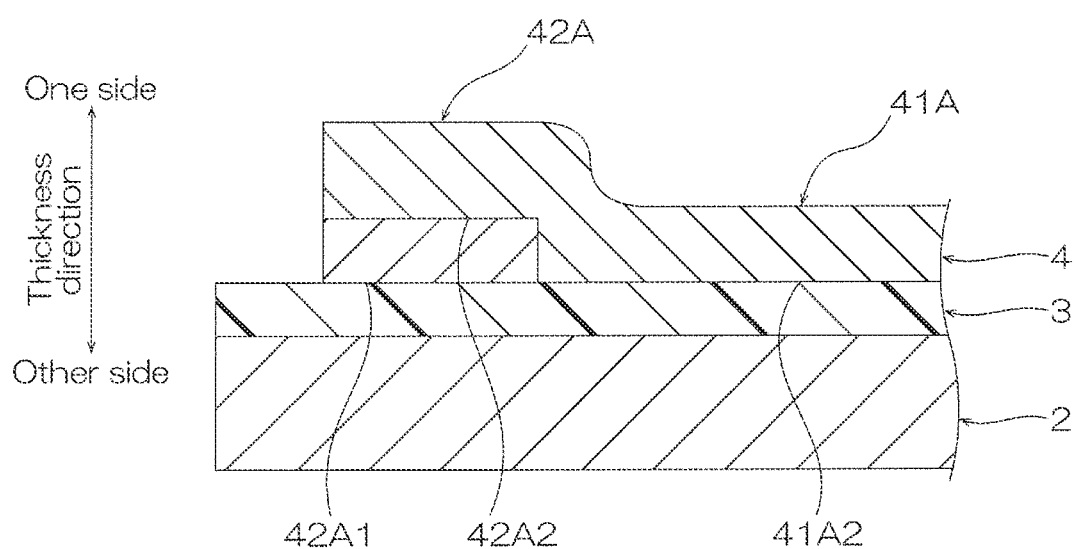
FIG. 3 shows a wiring circuit board of a first modified example.

As shown in FIG. 3, in the first modified example, the terminal 42A includes the first terminal layer 42A1 and the second terminal layer 42A2 having the same thickness as one embodiment. Furthermore, in the first modified example, the wiring 41A does not include the first wiring layer 41A1, and includes the second wiring layer 41A2. In the first modified example, the wiring 41A preferably consists of the second wiring layer 41A2.

The second wiring layer 41A2 is continuous with the second terminal layer 42A2. One end portion of the second wiring layer 41A2 in the first direction is in contact with the other end surface of the first terminal layer 42A1 in the first direction.

In the first modified example, the second wiring layer 41A2 has the same thickness as the second terminal layer 42A2.

3.2 Second Modified Example

Figure 4:
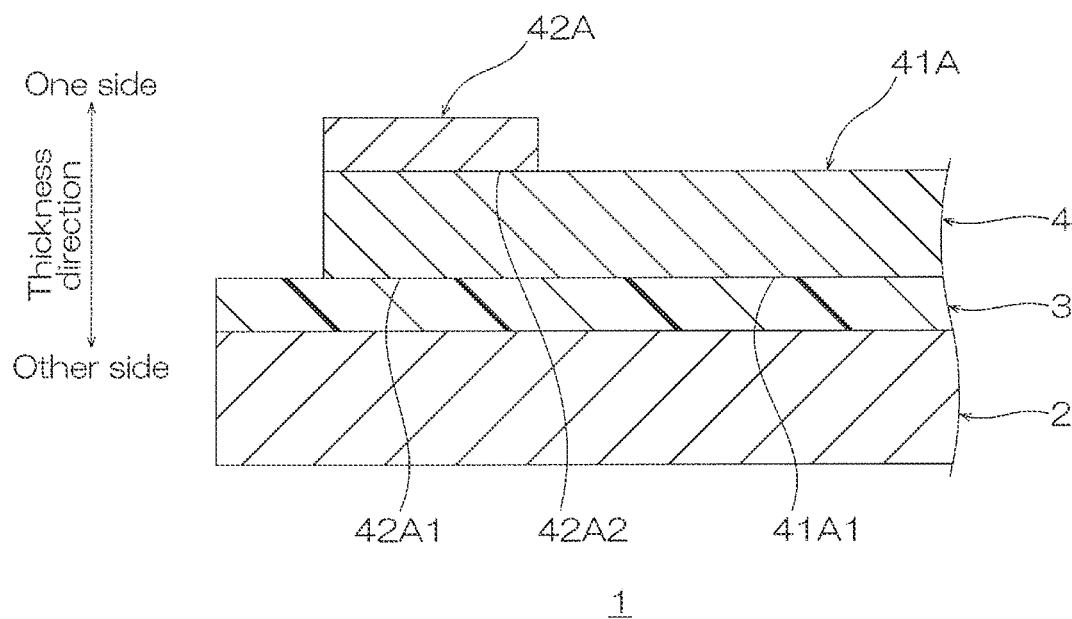
FIG. 4 shows a wiring circuit board of a second modified example.

As shown in FIG. 4, in the terminal 42A in the second modified example, the first terminal layer 42A1 is thicker than the second terminal layer 42A2. The ratio of the thickness of the first terminal layer 42A1 to the thickness of the second terminal layer 42A2 is the same as the ratio of the thickness of the second terminal layer 42A2 to the thickness of the first terminal layer 42A1 in one embodiment.

3.3 Third Modified Example

Figure 5:
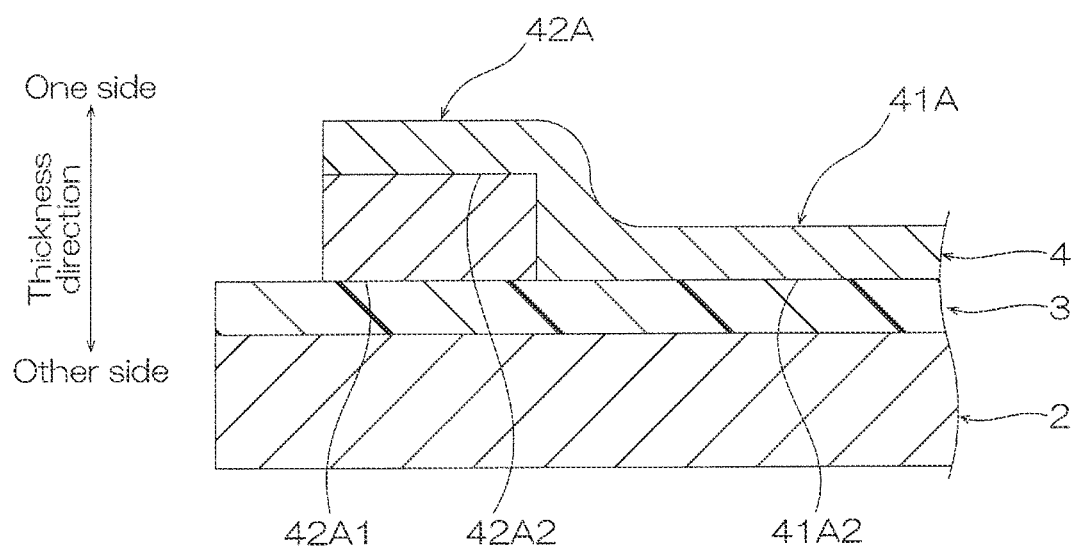
FIG. 5 shows a wiring circuit board of a third modified example.

As shown in FIG. 5, in the third modified example, the terminal 42A includes the first terminal layer 42A1 and the second terminal layer 42A2 having the same thickness as the second modified example. Furthermore, in the third modified example, the wiring 41A does not include the first wiring layer 41A1, and includes the second wiring layer 41A2. In the third modified example, the wiring 41A preferably consists of the second wiring layer 41A2.

The second wiring layer 41A2 is continuous with the second terminal layer 42A2. One end portion of the second wiring layer 41A2 in the first direction is in contact with the other end surface of the first terminal layer 42A1 in the first direction.

In the third modified example, the second wiring layer 41A2 has the same thickness as the second terminal layer 42A2.

3.4 Fourth Modified Example

Figure 6:
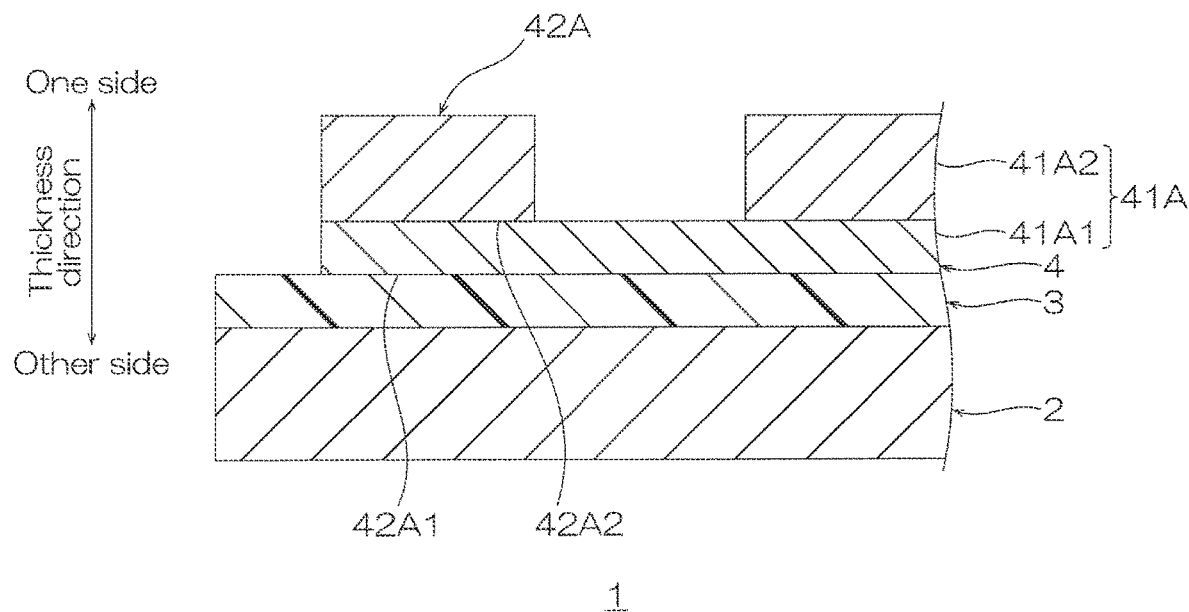
FIG. 6 shows a wiring circuit board of a fourth modified example.

As shown in FIG. 6, in the fourth modified example, the terminal 42A includes the first terminal layer 42A1 and the second terminal layer 42A2 having the same thickness as one embodiment. The wiring 41A further includes the second wiring layer 41A2 in the intermediate portion in the first direction. The second wiring layer 41A2 is disposed on one surface of the first wiring layer 41A1 in the thickness direction. The second wiring layer 41A2 has the same thickness as or different thickness from the second terminal layer 42A2. In the fourth modified example, the second wiring layer 41A2 preferably has the same thickness as the second terminal layer 42A2.

3.5 Fifth Modified Example

Figure 7:
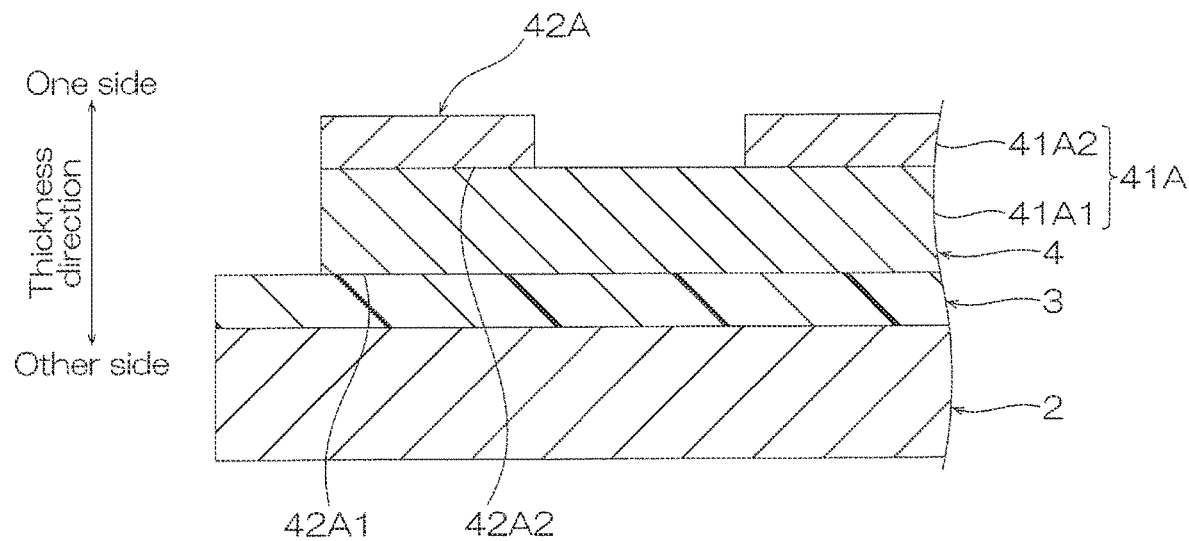
FIG. 7 shows a wiring circuit board of a fifth modified example.

As shown in FIG. 7, in the fifth modified example, the terminal 42A includes the first terminal layer 42A1 and the second terminal layer 42A2 having the same thickness as the second modified example. The wiring 41A further includes the second wiring layer 41A2 in the intermediate portion in the first direction. The second wiring layer 41A2 is disposed on one surface of the first wiring layer 41A1 in the thickness direction. The second wiring layer 41A2 has the same thickness as or different thicknesses from the second terminal layer 42A2. In the fourth modified example, the second wiring layer 41A2 preferably has the same thickness as the second terminal layer 42A2.

3.6 Sixth Modified Example

Figure 8:
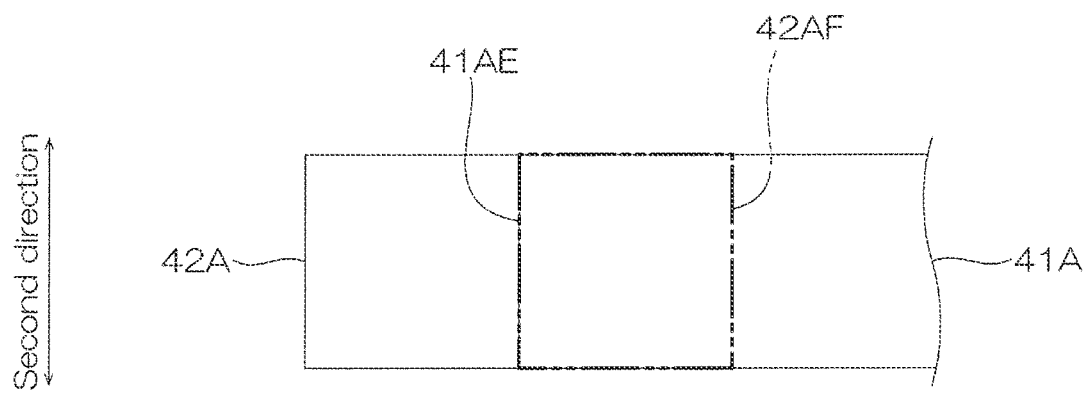
FIG. 8 shows a wiring circuit board of a sixth modified example.

As shown in FIG. 8, the wiring 41A does not have the recessed portion 41A0 (ref: FIG. 1). In the sixth modified example, one end portion of the wiring 41A in the first direction has a straight shape extending in the first direction.

3.7 Seventh Modified Example

Figure 9:
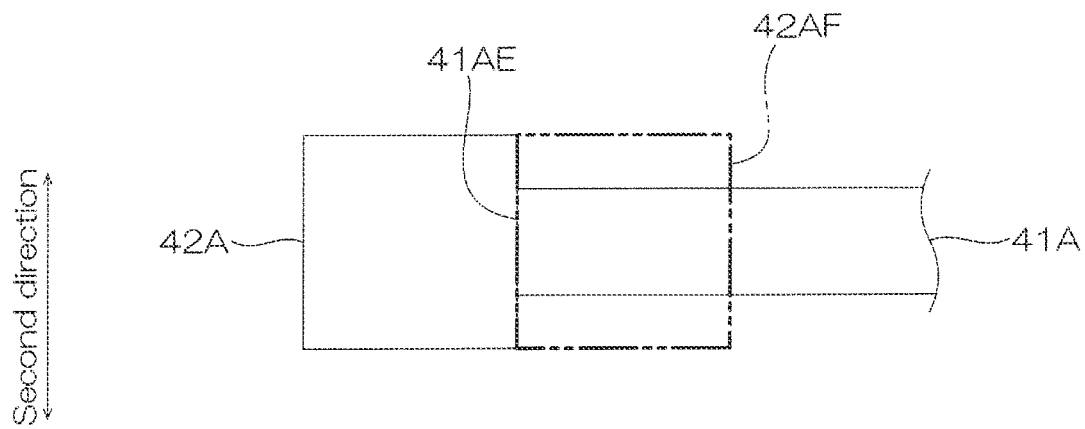
FIG. 9 shows a wiring circuit board of a seventh modified example.

As shown in FIG. 9, in the seventh modified example, the length of the terminal 42A in the second direction is longer than the width of the wiring 41A. In the seventh modified example, the terminal 42A has a land shape when viewed in the thickness direction. Specifically, in the second direction, both end surfaces of the wiring 41A are located inside from both end surfaces of the terminal 42A.

3.8 Eighth Modified Example

Figure 10:
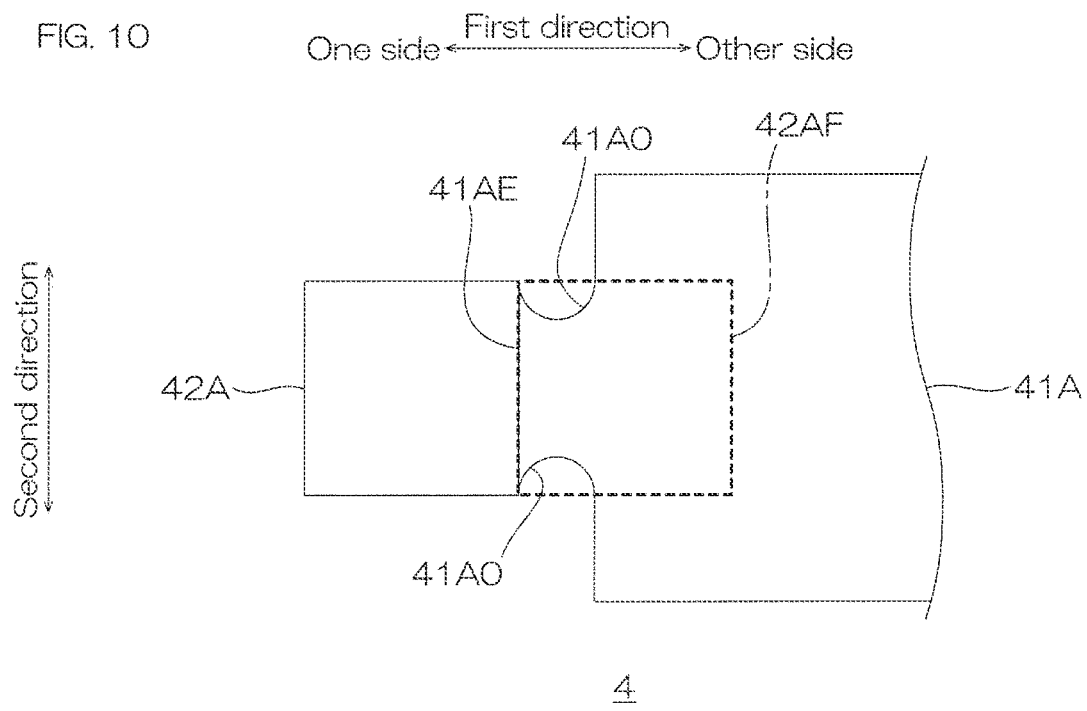
FIG. 10 shows a wiring circuit board of an eighth modified example.

As shown in FIG. 10, in the eighth modified example, the length of the wiring 41A in the second direction is longer than the width of the terminal 42A. Specifically, in the second direction, both end surfaces of the terminal 42A are located inside from both end surfaces of the wiring 41A.

3.9 Ninth Modified Example

Figure 11:
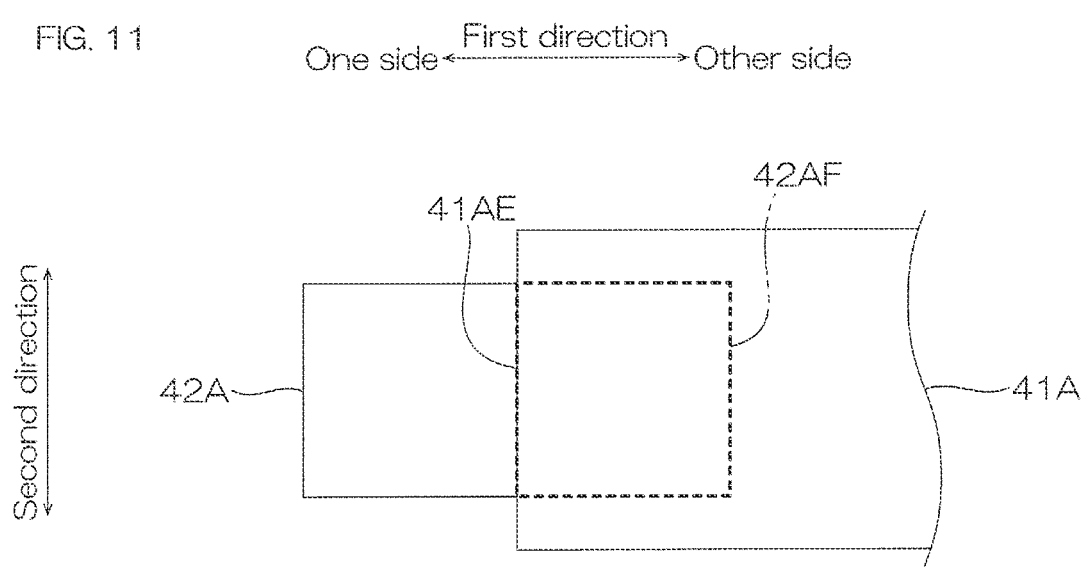
FIG. 11 shows a wiring circuit board of a ninth modified example.

As shown in FIG. 11, in the ninth modified example, the length of the wiring 41A in the second direction is longer than the width of the terminal 42A, and the wiring 41A does not have the recessed portion 41A0 (ref: FIG. 1).

3.10 Tenth Modified Example

Figure 12A:
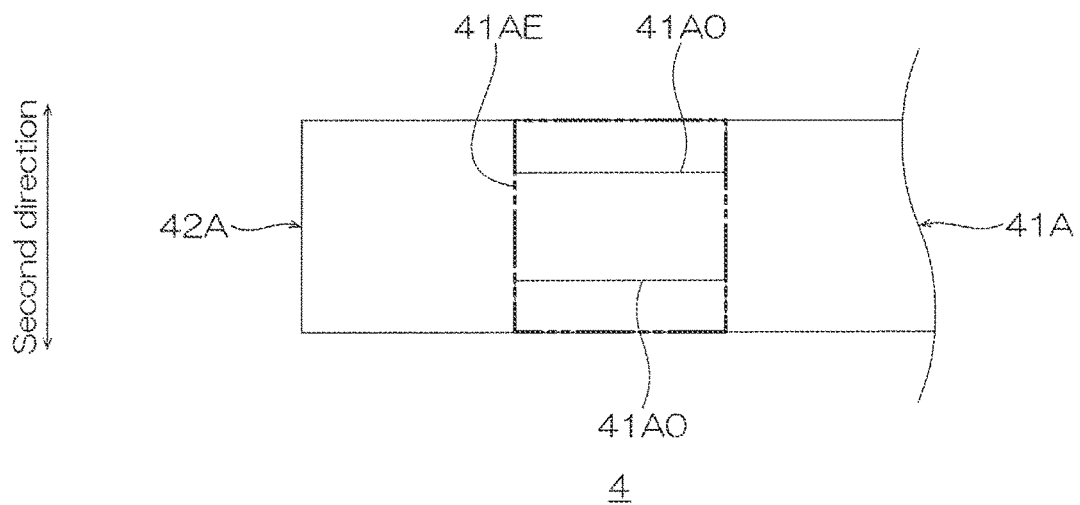
FIGS. 12A and 12B show a wiring circuit board of a tenth modified example.
Figure 12B:
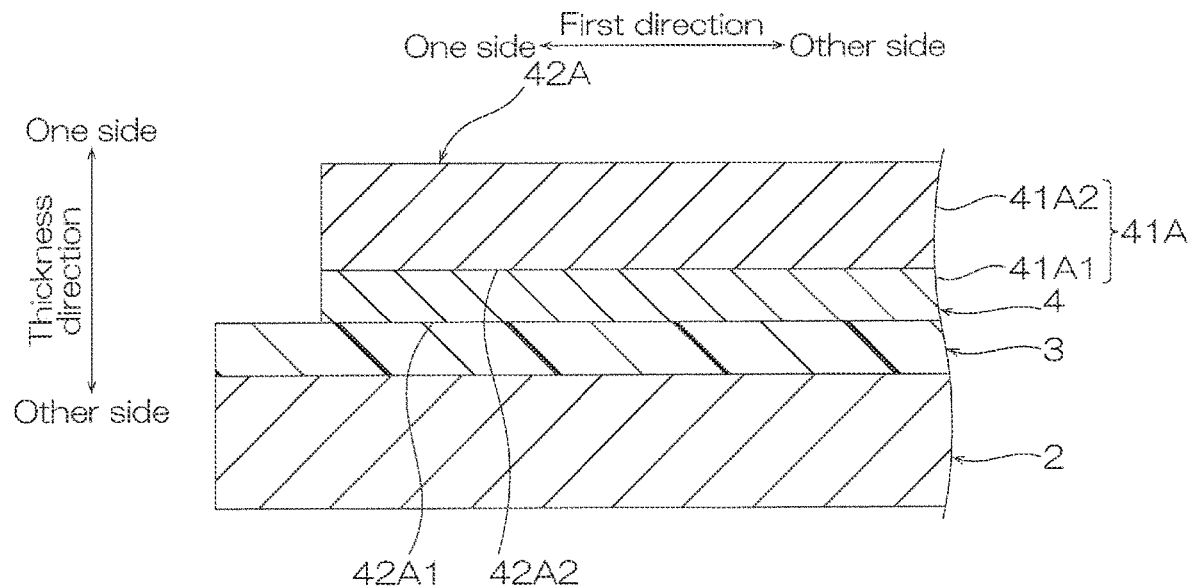

As shown in FIGS. 12A and 12B, in the tenth modified example, the wiring 41A includes the first wiring layer 41A1 and the second wiring layer 41A2 in one end portion and the intermediate portion in the first direction.

In the tenth modified example, as in one embodiment, the first wiring layer 41A1 is continuous with the first terminal layer 42A1. The second wiring layer 41A2 is continuous with the second terminal layer 42A2. Each of the two recessed portions 41A0 in the first wiring 41A has a generally rectangular shape when viewed in the thickness direction.

In the tenth modified example, the one end edge 41AE of the wiring 41A in the first direction is defined by a line connecting one end edges of the two recessed portions 41A0.

3.11 Eleventh Modified Example

Although not shown, the wiring circuit board 1 of the eleventh modified example does not include the metal supporting layer 2.

One embodiment is preferable as compared with the eleventh modified example. Since the wiring circuit board 1 of one embodiment further includes the metal supporting layer 2 disposed on the other surface of the base insulating layer 3 in the thickness direction, it is possible to escape the heat transferred to the terminal 42A not only to the wiring 41A but also to the metal supporting layer 2.

3.12 Twelfth Modified Example

Although not shown, in the wiring circuit board 1 of the twelfth modified example, the conductive pattern 4 includes the wiring 41A and the terminal 42A having the above-described volume ratio (Y/X) of 0.1 or more. In the twelfth modified example, the wiring circuit board 1 includes another conductive pattern including a wiring and a terminal. In the twelfth modified example, the wiring and the terminal in the other conductive pattern have the above-described volume ratio (Y/X) of below 0.1.

One embodiment is preferable as compared with the twelfth modified example.

In the twelfth modified example, when the heat is applied simultaneously to the above-described terminal 42A and the terminal in the other conductive pattern, it is impossible to suppress the peeling of the other terminal from the base insulating layer 3, while it is possible to suppress the peeling of the terminal 42A from the base insulating layer 3.

On the other hand, in the wiring circuit board 1 of one embodiment, the ratio of the volume Y of each of the wirings 41A, 41B, 41C, and 41D in each of the folded regions 42AF, 42BF, 42CF, and 42DF with respect to the volume X of each of the plurality of terminals 42A, 42B, 42C, and 42D is 0.1 or more. Therefore, even when the heat is applied simultaneously to the plurality of terminals 42A, 42B, 42C, and 42D, it is possible to suppress the peeling of each of the plurality of terminals 42A, 42B, 42C, and 42D from the base insulating layer 3.

3.13 Thirteenth Modified Example

Figure 13A:
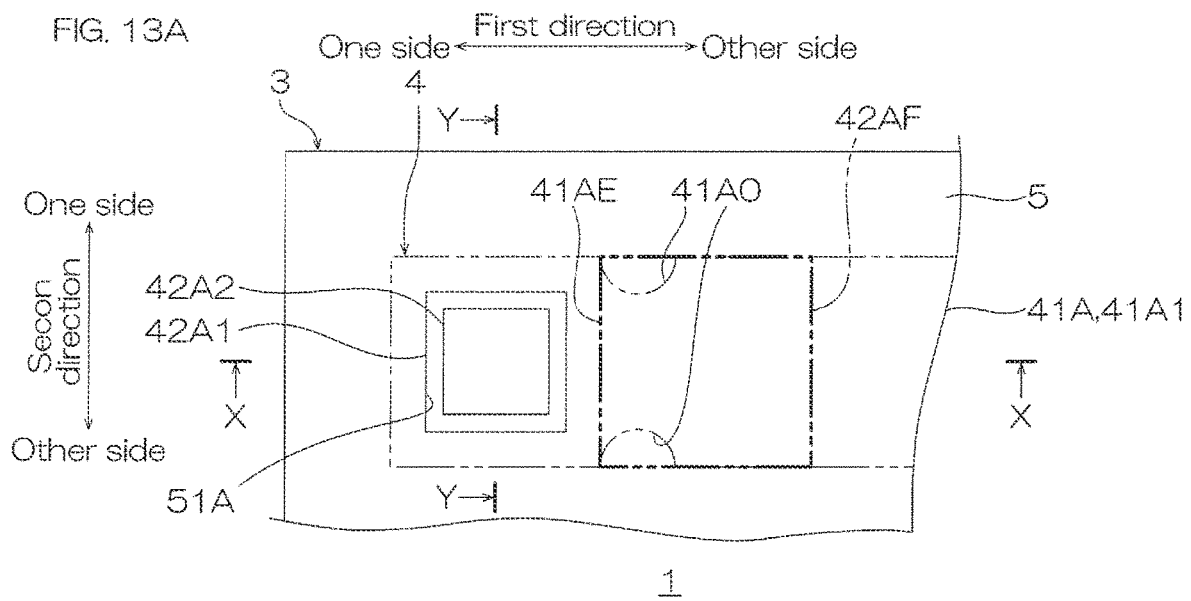
FIGS. 13A to 13C show a wiring circuit board of a thirteenth modified example.
Figure 13B:
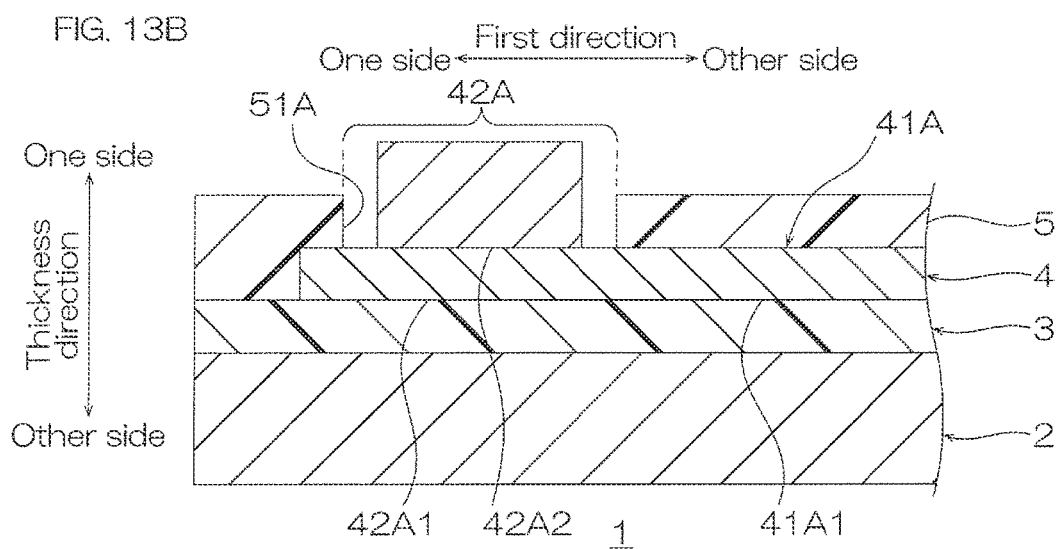
Figure 13C:
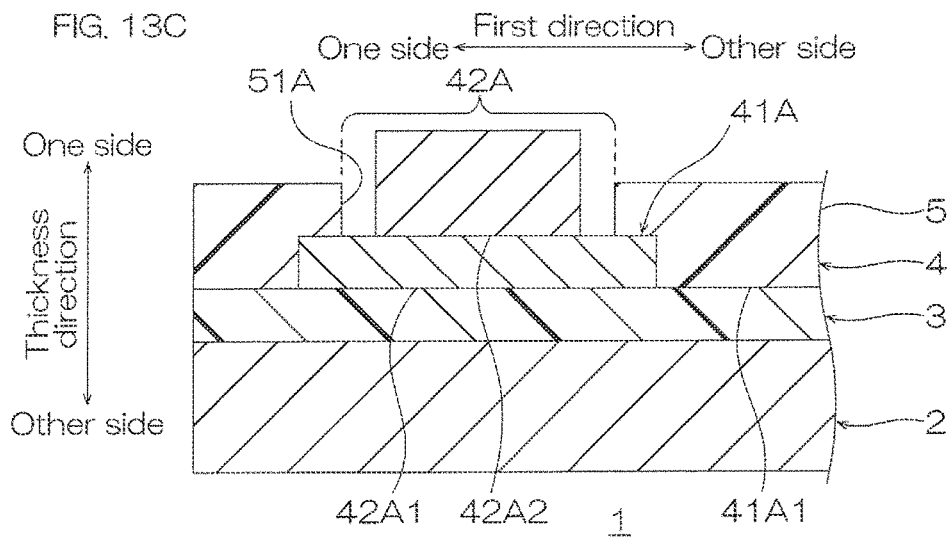

As shown in FIGS. 13A to 13C, the plurality of terminals 42A, 42B, 42C, and 42D may be defined as a portion exposed from the cover insulating layer 5 in the conductive pattern 4. For example, the cover insulating layer 5 has a plurality of opening portions 51A, 51B, 51C, and 51D. In FIGS. 13A to 13C, the plurality of opening portions 51B, 51C, and 51D are not shown. Each of the plurality of opening portions 51A, 51B, 51C, and 51D penetrates through the cover insulating layer 5 in the thickness direction. Each of the plurality of terminals 42A, 42B, 42C, and 42D is disposed inside each of the plurality of opening portions 51A, 51B, 51C, and 51D.

The cover insulating layer 5 covers a portion around the terminal layer 42 in the conductive pattern 5. In the thirteenth modified example, the second terminal layer 42A2 is smaller than the first terminal layer 42A1. The cover insulating layer 5 covers a portion around the first terminal layer 42A1 in the conductive pattern 4. The above-described surrounding portion includes the first wiring layer 41A1.

EXAMPLES

Next, the present invention is further described based on Examples and Comparative Example below. The present invention is however not limited by these Examples and Comparative Example. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

Figure 2:
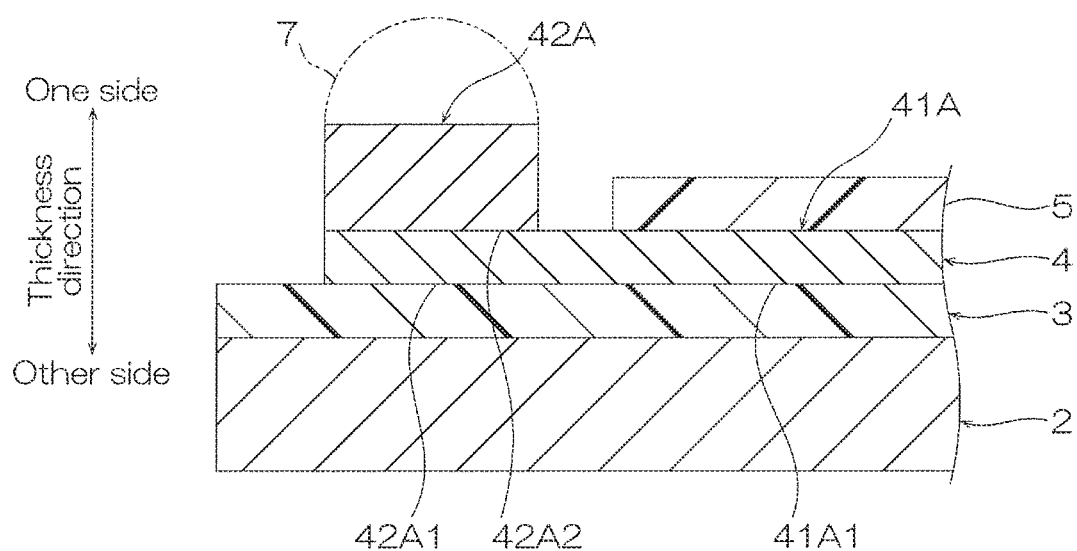
FIG. 2 shows a cross-sectional view along an X-X line in FIG. 1.

As shown in FIGS. 1 and 2, the wiring circuit board 1 corresponding to one embodiment and including the conductive pattern 4 having a volume ratio (Y/X) and a dimension described in Table 1 was prepared.

Example 2

As shown in FIG. 3, the wiring circuit board 1 corresponding to the first modified example and including the conductive pattern 4 having a volume ratio (Y/X) and a dimension described in Table 1 was prepared.

Example 3

As shown in FIG. 9, the wiring circuit board 1 corresponding to the seventh modified example and including the conductive pattern 4 having a volume ratio (Y/X) and a dimension described in Table 1 was prepared.

Comparative Example 1

Figure 14:
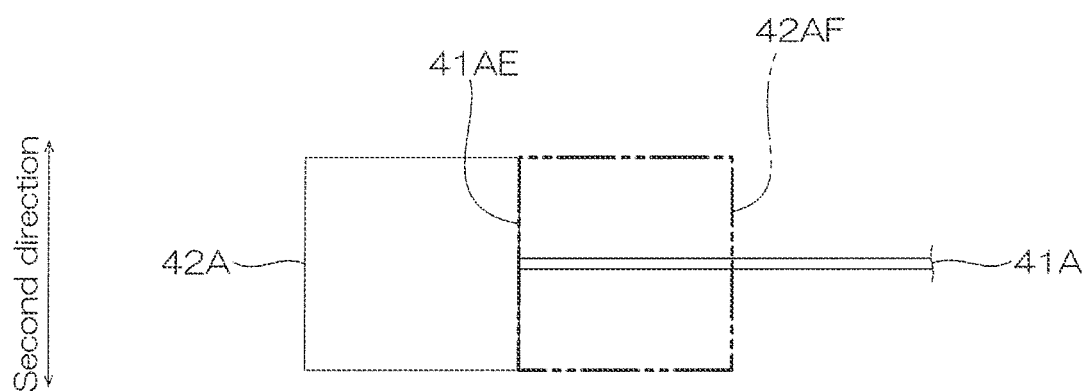
FIG. 14 shows an enlarged plan view of a wiring circuit board of Comparative Example 1.

As shown in FIG. 14, the wiring circuit board 1 including the conductive pattern 4 having a volume ratio (Y/X) and a dimension described in Table 1 was prepared.
<Peeling Test>
The solder 7 was disposed on one surface of the terminal 42A. At this time, the solder 7 was heated using a laser having the output of 0.15 J.

Thereafter, the shearing force along the first direction was applied to the terminal 42A using a blade so as to be peeled on the interface between the terminal 42A and the base insulating layer 3. The shearing force was 4.9 N.

As a result, in Comparative Example 1, the terminal 42A was peeled from the base insulating layer 3.

On the other hand, in Examples 1, 2, and 3, each of the terminals 42A was not peeled from the base insulating layer 3.

The results of the peeling test described above and the volume ratio (Y/X) were described in Table 1.

TABLE 1

| | Dimension | Ex. 1 | Ex. 2 | Ex. 3 | Comparative Ex. 1 |
|---|---|---|---|---|---|
| Terminal | Length in First Direction (μm) | 300 | 300 | 300 | 300 |
| | Length in Second Direction (μm) | 300 | 300 | 300 | 300 |
| | Thickness of First Terminal Layer (μm) | 10 | 10 | 10 | 10 |
| | Thickness of Second Terminal Layer (μm) | 20 | 20 | 20 | 20 |
| | Volume X (μm$^3$) | 2700000 | 2700000 | 2700000 | 2700000 |
| Wiring in Folded Region | Length in First Direction (μm) | 300 | 300 | 300 | 300 |
| | Width of Intermediate Portion (μm) | 300 | 300 | 180 | 65 |
| | Thickness of First Wiring Layer (μm) | 10 | — | 10 | 10 |
| | Thickness of Second Wiring Layer (μm) | — | 20 | — | — |
| | Diameter of Recessed Portion (μm$^2$) | 150 | 150 | — | — |
| | Opening Area of Recessed Portion (μm$^2$) | 8836 | 8836 | — | — |
| | Area of Wiring (μm$^2$) | 81164 | 81164 | 54000 | 19500 |
| | Volume Y (μm$^3$) | 811643 | 1623285 | 540000 | 195000 |
| | Volume Ratio (Y/X) | 0.30 | 0.60 | 0.20 | 0.07 |
| | Correspondence Figure | FIGS. 1 and 2 | FIG. 3 | FIG. 9 | FIG. 14 |
| | Peeling Test | Absence of Peeling | Absence of Peeling | Absence of Peeling | Presence of Peeling |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

DESCRIPTION OF REFERENCE NUMERALS

1 Wiring circuit board
2 Metal supporting layer
4 Conductive pattern
41A, 41B, 41C, 41D Wiring
41A1, 41B1, 41C1, 41D1 First wiring layer
41A2 Second wiring layer
41AE, 41BE, 41OE, 41DE One end edge
42A, 42B, 42C, 42D Terminal
42A1 First terminal layer
42A2 Second terminal layer
42AF, 42BF, 42CF, 42DF Folded region
X Volume of wiring
Y Volume of terminal

The invention claimed is:

1. A wiring circuit board comprising:
an insulating layer, and
a conductive pattern disposed on one surface of the insulating layer in a thickness direction, wherein
the conductive pattern includes
a wiring, and
a terminal protruding from one end edge of the wiring;
the terminal includes
a first terminal layer disposed on one surface of the insulating layer in the thickness direction, and
a second terminal layer disposed on one surface of the first terminal layer in the thickness direction; and a ratio (Y/X) of the volume Y of the wiring in a folded region of the terminal when viewed in the thickness direction with respect to the volume X of the terminal is 0.1 or more, the folded region being folded back toward the opposite side in a protruding direction of the terminal with the one end edge of the wiring as a starting point.

2. The wiring circuit board according to claim 1, wherein the wiring consists of a first wiring layer continuous with the first terminal layer or a second wiring layer continuous with the second terminal layer.

3. The wiring circuit board according to claim 1 further comprising:
a metal supporting layer disposed on the other surface of the insulating layer in the thickness direction.

4. The wiring circuit board according to claim 2 further comprising:
a metal supporting layer disposed on the other surface of the insulating layer in the thickness direction.

5. The wiring circuit board according to claim 1, wherein the conductive pattern includes
a plurality of wirings spaced apart from each other, and
a plurality of terminals corresponding to the plurality of wirings, each of the terminals protruding from one end edge of each of the plurality of wirings;
each of the plurality of terminals includes the first terminal layer and the second terminal layer; and
a ratio (Y/X) of the volume Y of the wiring in each of a plurality of folded regions when each region of the plurality of terminals when viewed in the thickness direction is folded back toward the opposite side in the protruding direction of each terminal with the one end edge of each of the plurality of wirings as the starting point with respect to the volume X of each of the plurality of terminals is 0.1 or more.

6. The wiring circuit board according to claim 2, wherein the conductive pattern includes
a plurality of wirings spaced apart from each other, and
a plurality of terminals corresponding to the plurality of wirings, each of the terminals protruding from one end edge of each of the plurality of wirings;
each of the plurality of terminals includes the first terminal layer and the second terminal layer; and a ratio (Y/X) of the volume Y of the wiring in each of a plurality of folded regions when each region of the plurality of terminals when viewed in the thickness direction is folded back toward the opposite side in the protruding direction of each terminal with the one end edge of each of the plurality of wirings as the starting point with respect to the volume X of each of the plurality of terminals is 0.1 or more.

7. The wiring circuit board according to claim 1, wherein the ratio (Y/X) is below 1.

8. The wiring circuit board according to claim 2, wherein the ratio (Y/X) is below 1.

\* \* \* \* \*